(12) United States Patent
Racine et al.

(10) Patent No.: US 12,490,640 B2
(45) Date of Patent: Dec. 2, 2025

(54) LIGHT-EMITTING DEVICE

(71) Applicant: COMMISSARIAT A L'ENERGIE ATOMIQUE ET AUX ENERGIES ALTERNATIVES, Paris (FR)

(72) Inventors: Benoit Racine, Grenoble (FR); Gilles Le Blevennec, Grenoble (FR); Etienne Quesnel, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 354 days.

(21) Appl. No.: 18/258,488

(22) PCT Filed: Dec. 15, 2021

(86) PCT No.: PCT/EP2021/085886
§ 371 (c)(1),
(2) Date: Jun. 20, 2023

(87) PCT Pub. No.: WO2022/136051
PCT Pub. Date: Jun. 30, 2022

(65) Prior Publication Data
US 2024/0306424 A1    Sep. 12, 2024

(30) Foreign Application Priority Data
Dec. 22, 2020  (FR) ...................... 20 13919

(51) Int. Cl.
*H10K 59/80* (2023.01)
(52) U.S. Cl.
CPC ... *H10K 59/8793* (2023.02); *H10K 59/80515* (2023.02); *H10K 59/80521* (2023.02); *H10K 59/879* (2023.02)

(58) Field of Classification Search
CPC ......... H10K 59/8793; H10K 59/80515; H10K 59/80521
(Continued)

(56) References Cited

U.S. PATENT DOCUMENTS

| 8,247,834 B2 | 8/2012 | Kim et al. |
| 2009/0021153 A1 | 1/2009 | Lee et al. |

(Continued)

FOREIGN PATENT DOCUMENTS

| JP | 2000-195673 A | 7/2000 |
| JP | 2003-163087 A | 6/2003 |
| KR | 10-2019-0075218 A | 7/2019 |

OTHER PUBLICATIONS

International Search Report issued Apr. 4, 2022 in PCT/EP2021/085886, filed on Dec. 15, 2021, 2 pages.

*Primary Examiner* — Christopher M Raabe
(74) *Attorney, Agent, or Firm* — Oblon, McClelland, Maier & Neustadt, L.L.P.

(57) ABSTRACT

A light-emitting device includes a first electrode reflecting in a spectral range, a second electrode, and a light-emitting layer extending between the first and second electrodes and configured to emit electromagnetic radiation in the spectral range, the electromagnetic radiation emitted by the light-emitting layer being circularly polarized in a first polarization direction, the electromagnetic radiation reflected by the first electrode being circularly polarized in a second polarization direction, opposite to the first polarization direction. The second electrode is structured so as to define opaque patterns in the spectral range, arranged to block transmission of the circularly polarized electromagnetic radiation in the first polarization direction, and a spacing zone spacing apart the opaque patterns from one another and transparent in the spectral range so as to allow transmission of the circularly (Continued)

polarized electromagnetic radiation in the second polarization direction.

13 Claims, 3 Drawing Sheets

(58) Field of Classification Search
USPC .................................................. 313/498–512
See application file for complete search history.

(56) References Cited

U.S. PATENT DOCUMENTS

| | | | |
|---|---|---|---|
| 2010/0096563 A1* | 4/2010 | Ponjee ............... | G01N 21/0303 |
| | | | 250/459.1 |
| 2011/0001905 A1 | 1/2011 | Tanaka | |
| 2014/0326956 A1 | 11/2014 | Wang et al. | |
| 2019/0131351 A1* | 5/2019 | Park ................... | H10K 59/8791 |
| 2023/0157063 A1* | 5/2023 | Park ................. | H10K 59/80515 |
| | | | 257/40 |

* cited by examiner

LIGHT-EMITTING DEVICE

TECHNICAL FIELD

The invention relates to the technical field of light-emitting devices, notably organic light-emitting devices. More specifically, the invention aims to obtain a light-emitting device emitting circularly polarized electromagnetic radiation with a high degree of polarization.

The invention is notably applicable in biology imaging and more generally in the field of health, or even in 2D and 3D displays.

PRIOR ART

An organic light-emitting device known from the prior art, notably from the document by Zinna et al., "*Highly Circularly Polarized Electroluminescence from a Chiral Europium Complex*", Advanced Materials, vol. 27, No. 10, 2015, comprises:
- a first reflective electrode made of aluminum;
- a second transparent electrode made of ITO (Indium Tin Oxide);
- an organic light-emitting layer, formed between the first and second electrodes, and adapted to emit circularly polarized electromagnetic radiation in a first polarization direction.

Such a device of the prior art does not allow circularly polarized electromagnetic radiation to be emitted, with a high degree of polarization, as output from the second electrode.

Indeed, the portion of the electromagnetic radiation emitted by the organic light-emitting layer that reflects onto the first electrode has a second polarization direction, opposite to the first polarization direction. However, the degree of polarization, denoted g, proves the following relation:

$$g = 2\frac{I_L - I_R}{I_L + I_R}$$

where:
- $I_R$ is the intensity of the electromagnetic radiation, circularly polarized in the first polarization direction, output from the second electrode;
- $I_L$ is the intensity of the electromagnetic radiation, circularly polarized in the second polarization direction, output from the second electrode.

The reflection of the portion of the electromagnetic radiation emitted by the organic light-emitting layer onto the first electrode leads to a reduction in the degree of polarization g because $I_L$ is of the same order of magnitude as $I_R$.

In addition, as illustrated in FIG. 1 for a top-emitting architecture, an organic light-emitting device known from the prior art comprises:
- a first reflective electrode $E_1$;
- a second semi-transparent electrode $E_1$;
- an organic light-emitting layer EL, formed between the first and second electrodes $E_1$, $E_1$, and adapted to emit circularly polarized electromagnetic radiation in a first polarization direction.

Similarly, such a device of the prior art does not allow circularly polarized electromagnetic radiation, with a high degree of polarization, to be emitted as output from the second electrode $E_2$. Indeed, the portion of the electromagnetic radiation emitted by the organic light-emitting layer EL that reflects onto the first electrode $E_1$ has a second polarization direction, opposite to the first polarization direction. The reflection of the portion of the electromagnetic radiation emitted by the organic light-emitting layer EL onto the first electrode $E_1$ leads to a reduction in the degree of polarization g because $I_L$ is of the same order of magnitude as $I_R$.

DISCLOSURE OF THE INVENTION

The aim of the invention is to overcome all or part of the aforementioned disadvantages. To this end, the subject matter of the invention is a light-emitting device, comprising:
- a first electrode, reflecting in a spectral range;
- a second electrode;
- a light-emitting layer, extending between the first and second electrodes, and adapted to emit electromagnetic radiation in the spectral range, the electromagnetic radiation emitted by the light-emitting layer being circularly polarized in a first polarization direction, the electromagnetic radiation reflected by the first electrode being circularly polarized in a second polarization direction, opposite to the first polarization direction;

characterized in that the second electrode is structured so as to define:
- opaque patterns in the spectral range, arranged to block transmission of the circularly polarized electromagnetic radiation in the first polarization direction;
- a spacing zone, spacing apart the opaque patterns from one another, and transparent in the spectral range so as to allow transmission of the circularly polarized electromagnetic radiation in the second polarization direction.

Definitions

The term "reflective" is understood to mean that the first electrode has an intensity reflection coefficient, averaged over the spectral range, that is greater than or equal to 70%, preferably greater than or equal to 80%, more preferably greater than or equal to 90%.

The expression "extending between" does not necessarily imply that the light-emitting layer is in contact with the first and second electrodes. The device can comprise, for example, transport layers (electrons and holes) and injection layers (electrons and holes) extending between an electrode and the light-emitting layer (called emissive layer).

The expression "circularly polarized" can also cover a state of polarization that is strictly elliptical when the components of the electric (or magnetic) field are only slightly different in intensity during the propagation of the electromagnetic radiation.

The term "structured" is understood to mean that the second electrode has disruptions in the flatness defining a set of patterns.

The term "opaque" is understood to mean that the patterns have an intensity transmission coefficient, averaged over the spectral range, that is less than or equal to 10%, preferably less than or equal to 5%, more preferably less than or equal to 1%, or even tending toward 0%.

The term "transparent" is understood to mean that the spacing zone has an intensity transmission coefficient, averaged over the spectral range, that is greater than or equal to 70%, preferably greater than or equal to 80%, more preferably greater than or equal to 90%.

Thus, such a device according to the invention allows circularly polarized electromagnetic radiation to be emitted in the second polarization direction, with a high degree of polarization, as output from the second structured electrode.

In other words, $I_L \gg I_R$, where:

$I_R$ is the intensity of the electromagnetic radiation, circularly polarized in the first polarization direction, output from the second structured electrode;

$I_L$ is the intensity of the electromagnetic radiation, circularly polarized in the second polarization direction (opposite to the first polarization direction), output from the second structured electrode.

$I_R$ is derived from the direct propagation of the electromagnetic radiation emitted from the light-emitting layer toward the second structured electrode. $I_L$ is derived from the propagation of the electromagnetic radiation emitted from the light-emitting layer toward the first electrode, and being reflected on the first electrode.

$I_R$ is very low compared to $I_L$ because the direct propagation of the electromagnetic radiation, emitted from the light-emitting layer toward the second structured electrode, is blocked by the opaque patterns of the second structured electrode. However, the propagation of the electromagnetic radiation emitted from the light-emitting layer toward the first electrode, and being reflected on the first electrode, is, for its part, allowed in the spacing zone of the second structured electrode. As a result, the electromagnetic radiation exiting the second structured electrode is overwhelmingly circularly polarized in the second polarization direction.

The device according to the invention can comprise one or more of the following features.

According to one feature of the invention, the electromagnetic radiation emitted by the light-emitting layer comprises rays, oriented toward the second structured electrode, and forming refraction cones each having a base; and the opaque patterns are arranged so as to cover all or part of the bases of the refraction cones.

Definitions

The term "refraction cone" is understood to mean the cone with a half-angle at the apex that corresponds to the critical angle $\theta_c$, computed using the Snell-Descartes law for refraction, beyond which the rays are totally reflected when passing through a diopter between the light-emitting layer and the second structured electrode.

The term "base" is understood to mean the guide curve of the refraction cone.

Thus, one advantage provided by such an arrangement of the opaque patterns is to obtain (total or partial) blocking of the direct propagation of the electromagnetic radiation emitted from the light-emitting layer toward the second structured electrode. The blocking can be total when the opaque patterns entirely cover the bases of the refraction cones, and when the opaque patterns have a very low intensity transmission coefficient (for example, less than 1%).

According to one feature of the invention, the light-emitting layer comprises a first emissive surface oriented toward the second structured electrode, and the opaque patterns occupy a total surface area having an area ranging between 30% and 70% of the area of the first emissive surface.

Thus, one advantage provided by such a rate of coverage of the opaque patterns is to obtain a good compromise between:

blocking (by the opaque patterns) the direct propagation of the electromagnetic radiation emitted from the light-emitting layer toward the second structured electrode;

the transmission (in the spacing zone) of the propagation of the electromagnetic radiation emitted from the light-emitting layer toward the first electrode, and being reflected on the first electrode.

According to one feature of the invention, the first electrode comprises reflective patterns in the spectral range, arranged to form a reflection diffraction grating, and dimensioned to modulate the amplitude of the electromagnetic radiation such that:

the reflection diffraction grating reflects only the zero order of interference of the electromagnetic radiation;

the electromagnetic radiation exiting the reflection diffraction grating propagates at normal incidence.

Thus, one advantage provided by such a reflection diffraction grating is to control the propagation direction of the circularly polarized electromagnetic radiation in the second polarization direction (after reflection on the reflective patterns) in order to best position the spacing zone in order to increase its extraction.

According to one feature of the invention, the device comprises a transmission diffraction grating, comprising transparent patterns in the spectral range, dimensioned to modulate the phase of the electromagnetic radiation so as to control the circular polarization state of the electromagnetic radiation exiting the transmission diffraction grating.

Thus, one advantage provided by such a transmission diffraction grating is to be able to modify the resultant of the integrated polarization states on the area of the first emissive surface of the light-emitting layer. It is thus possible to control the circular polarization state of the electromagnetic radiation exiting the transmission diffraction grating so as to obtain a circularly polarized state in the second polarization direction as output from the second structured electrode, in order to increase its extraction.

According to one feature of the invention, the transmission diffraction grating is arranged in a position selected from among:

a first position, located between the first electrode and the light-emitting layer;

a second position, located between the light-emitting layer and the second structured electrode;

a third position, located on the second structured electrode.

According to one feature of the invention, the second structured electrode is made of a composite material comprising a metal matrix and a ceramic reinforcement.

Thus, one advantage that is achieved involves combining good opacity, by virtue of the ceramic reinforcement, and good electrical conduction, by virtue of the metal matrix.

According to one feature of the invention, the opaque patterns are electrically conductive, and the spacing zone forms slits periodically arranged so that the second structured electrode has a band-pass filter type frequency selective surface.

Thus, one advantage provided by such a Frequency Selective Surface (FSS) is to be able to filter certain frequencies of the spectral range.

According to one feature of the invention, the slits each have a cross-section in the form of an upper-case omega $\Omega$.

Definition

The term "transverse" is understood to mean a section that perpendicularly intersects the optical axis of the light-emitting device, in other words a section in a direction perpendicular to the normal to the emissive surfaces of the light-emitting layer.

Thus, one advantage that is provided is to enhance the chirality of the electromagnetic radiation emitted by the light-emitting layer, for example, when said layer is made of a chiral organic material.

According to one feature of the invention, the first electrode is made of a metal material.

According to one feature of the invention, the light-emitting layer is made of a chiral organic material.

According to one feature of the invention, the spectral range is selected from among:
  the visible range with wavelengths ranging between 400 nm and 780 nm;
  the UV-A range with wavelengths ranging between 315 nm and 400 nm;
  the near-infrared range with wavelengths ranging between 780 nm and 3 µm.

BRIEF DESCRIPTION OF THE DRAWINGS

Further features and advantages will become apparent from the detailed disclosure of various embodiments of the invention, with the disclosure being accompanied by examples and references to the accompanying drawings, in which.

It should be noted that the drawings described above are schematic, and are not to scale for the sake of legibility and to simplify their understanding. The cuts are made along the normal to the emissive surfaces of the light-emitting layer.

DETAILED DISCLOSURE OF THE EMBODIMENTS

The elements that are identical or perform the same function will use the same reference signs for the various embodiments, for the sake of simplification.

An aim of the invention is a light-emitting device, comprising:
  a first electrode $E_1$, reflecting in a spectral range;
  a second electrode $E_2$;
  a light-emitting layer EL, extending between the first and second electrodes $E_1$, $E_2$, and adapted to emit electromagnetic radiation in the spectral range, the electromagnetic radiation emitted by the light-emitting layer EL being circularly polarized in a first polarization direction, the electromagnetic radiation reflected by the first electrode $E_1$ being circularly polarized in a second polarization direction, opposite to the first polarization direction;
characterized in that the second electrode $E_2$ is structured so as to define:
  opaque patterns M in the spectral range, arranged to block transmission of the circularly polarized electromagnetic radiation in the first polarization direction;
  a spacing zone ZE, spacing apart the opaque patterns M from one another, and transparent in the spectral range so as to allow transmission of the circularly polarized electromagnetic radiation in the second polarization direction.

First Electrode

The first electrode $E_1$ is advantageously made of a metal material. The metal material is preferably selected from among Ag, Al, Cr, Co, Be.

Figure 7:
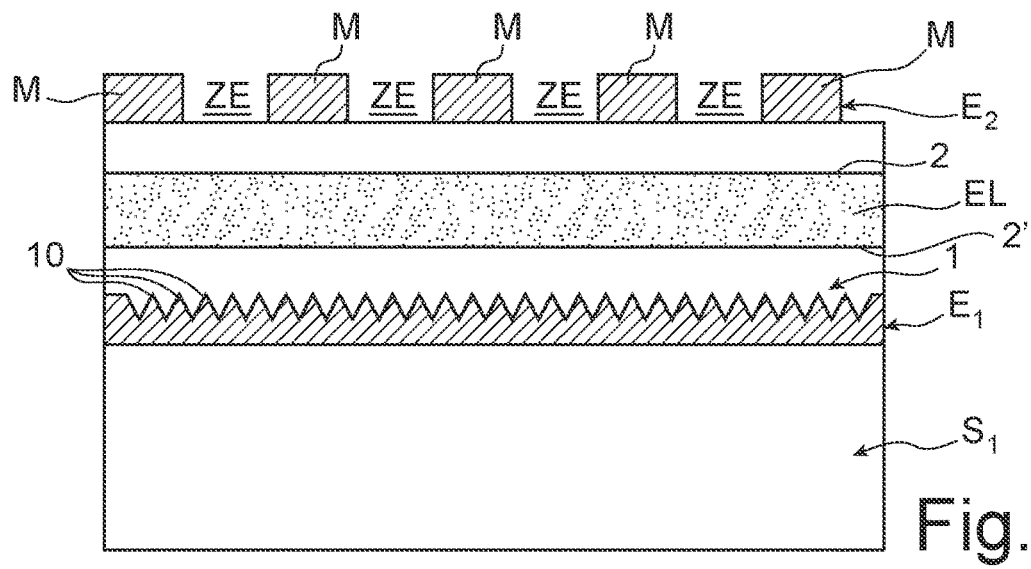
FIG. 7 is a schematic section view of a light-emitting device according to the invention, in a top-emitting architecture, illustrating an embodiment in which the first electrode comprises reflective patterns forming a reflection diffraction grating.
Figure 8:
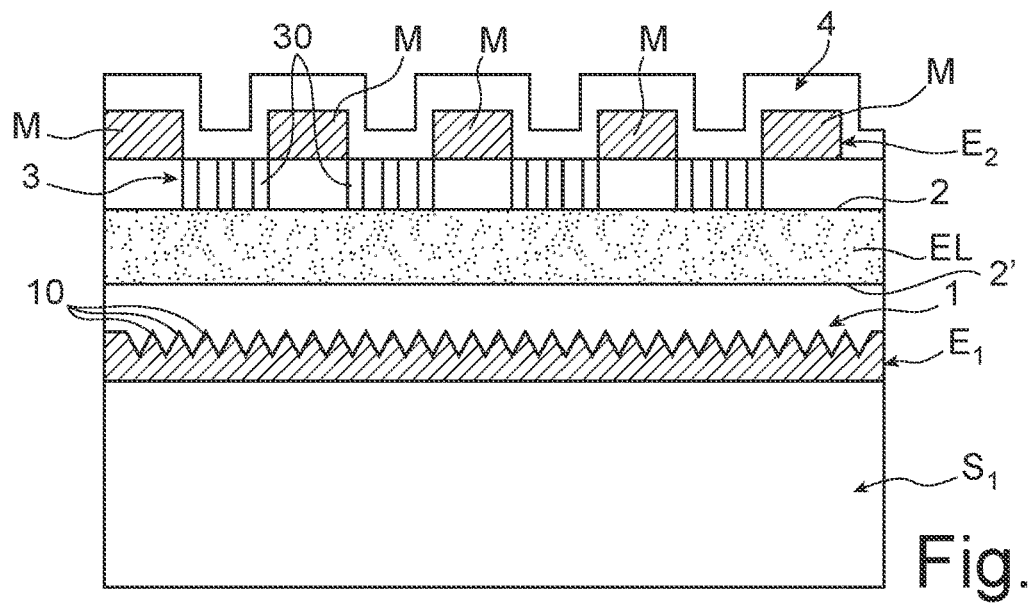
FIG. 8 is a view similar to FIG. 7, further illustrating the presence of a transmission diffraction grating and an encapsulation layer.

As illustrated in FIGS. 7 and 8, the first electrode $E_1$ advantageously comprises reflective patterns 10 in the spectral range, arranged to form a reflection diffraction grating 1, and dimensioned to modulate the amplitude of the electromagnetic radiation such that:
  the reflection diffraction grating 1 reflects only the zero order of interference of the electromagnetic radiation;
  the electromagnetic radiation exiting the reflection diffraction grating 1 propagates at normal incidence.

The dimensioning and the interval of the reflective patterns 10 can be computed using simulation software notably using the formula of reflection diffraction gratings, known to a person skilled in the art.

Second Structured Electrode

Figure 4:
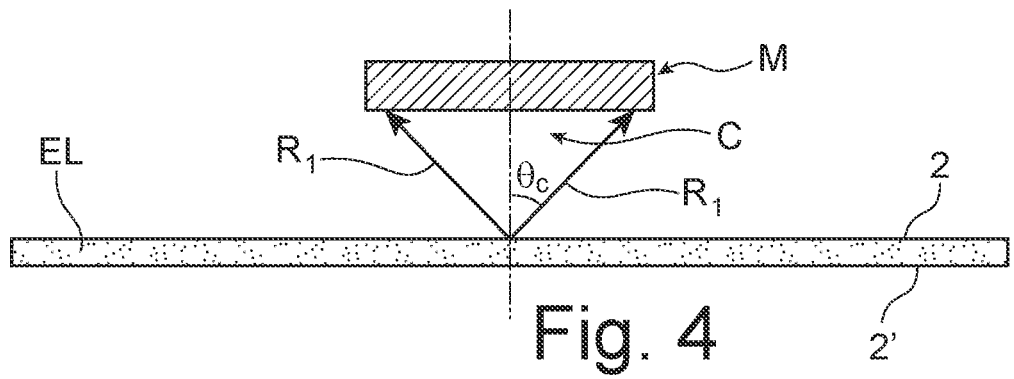
FIG. 4 is an explanatory schematic section view, illustrating a refraction cone of the electromagnetic radiation emitted by the light-emitting layer, and the critical angle beyond which the rays are totally reflected when passing through a diopter between the light-emitting layer and the second structured electrode.

As illustrated in FIG. 4, the electromagnetic radiation emitted by the light-emitting layer EL comprises rays $R_1$, oriented toward the second structured electrode $E_2$, forming refraction cones C each having a base. The opaque patterns M are advantageously arranged so as to cover all or part of the bases of the refraction cones C. The refraction cone C has a half-angle at the apex corresponding to the critical angle $\theta_c$, computed using the Snell-Descartes law for refraction, beyond which the rays $R_1$ are totally reflected when passing through a diopter between the light-emitting layer EL and the second structured electrode $E_2$. The critical angle $\theta_c$ can be of the order of 35°. The direct propagation of the electromagnetic radiation, emitted from the light-emitting layer EL to the second structured electrode $E_2$, is thus blocked by the opaque patterns M of the second structured electrode $E_2$.

Figure 1:
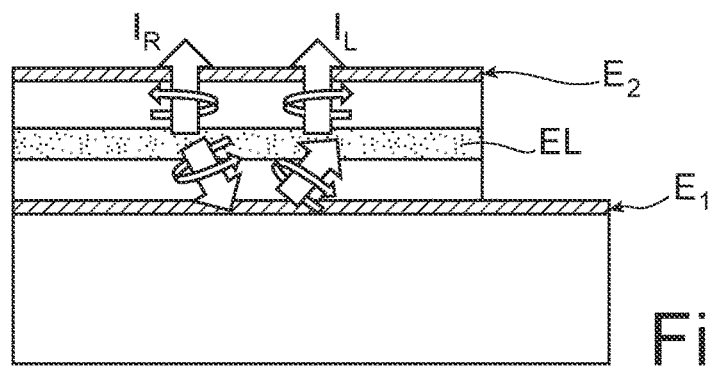
FIG. 1 (already described) is a schematic section view of a light-emitting device of the prior art.
Figure 2:
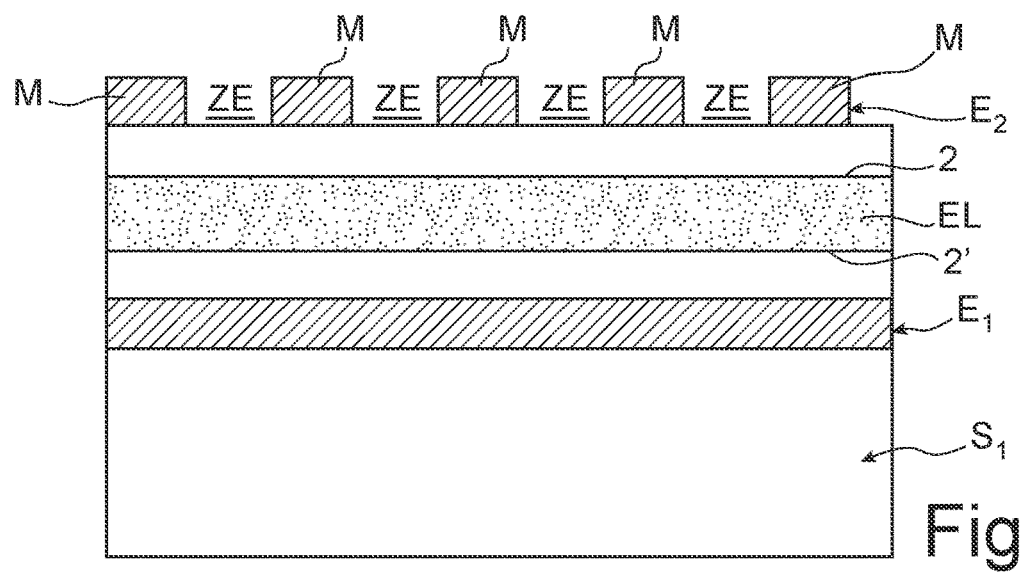
FIG. 2 is a schematic section view of a light-emitting device according to the invention, in a top-emitting architecture.
Figure 3:
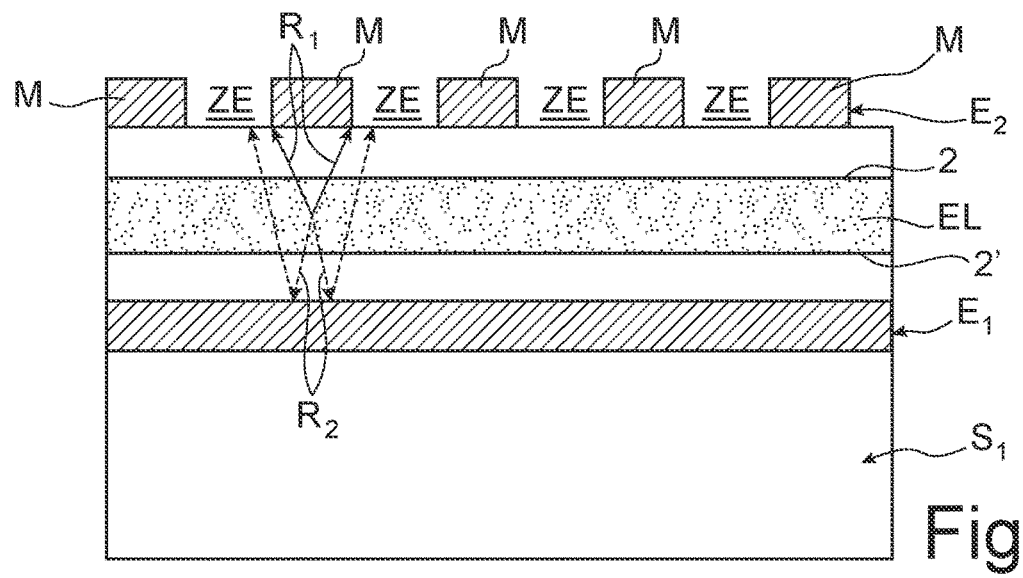
FIG. 3 is a view similar to FIG. 2, on an exploded scale, illustrating rays blocked by the opaque patterns and rays transmitted in the spacing zone.

As illustrated in FIG. 3, the electromagnetic radiation emitted by the light-emitting layer EL comprises rays $R_2$, oriented toward the first electrode $E_1$, that are reflected on the first electrode $E_1$, and then propagate through the spacing zone ZE. The propagation of the electromagnetic radiation emitted from the light-emitting layer EL toward the first electrode $E_1$, and being reflected on the first electrode, is thus allowed in the spacing zone ZE of the second structured electrode $E_2$.

Figure 5:
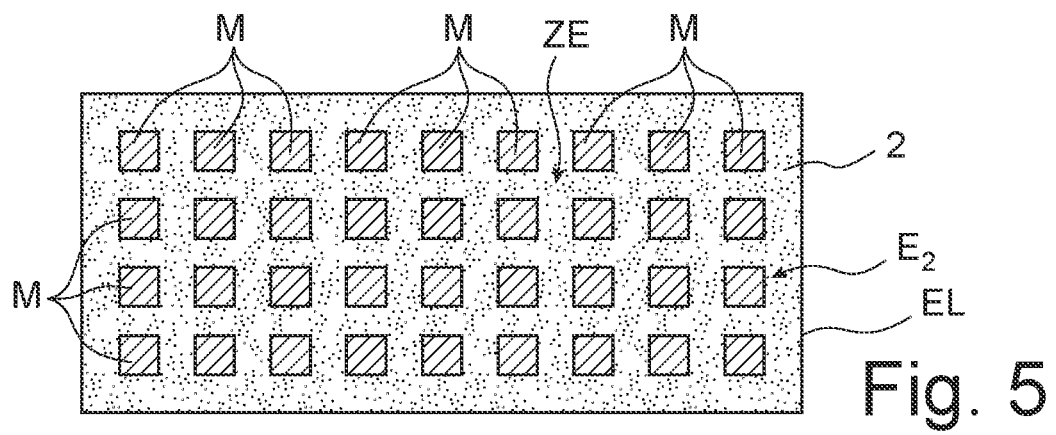
FIG. 5 is a partial schematic top view of a light-emitting device according to the invention.

As illustrated in FIG. 5, the light-emitting layer EL comprises a first emissive surface 2 oriented toward the second structured electrode $E_2$. More specifically, the light-emitting layer EL comprises opposite first and second emissive surfaces 2, 2'. The first emissive surface 2 is oriented toward the second structured electrode $E_2$, while the second emissive surface 2' is oriented toward the first electrode $E_1$. The opaque patterns M advantageously occupy a total surface area having an area ranging between 30% and 70% of the area of the first emissive surface 2. The areas of the first and second emissive surfaces 2, 2' are preferably equal. By way of a non-limiting example, each opaque pattern M can have an area of 0.6 $\mu m^2$. The opaque patterns M can have a quadrangular (for example, square, rectangular) or circular cross-section. However, other geometric shapes can be contemplated for the opaque patterns M.

The opaque patterns M defined by the second structured electrode $E_2$ are electrically conductive. The opaque patterns M allow the emission of the electromagnetic radiation to be located. More specifically, the light-emitting layer EL comprises emissive zones of the electromagnetic radiation that face the opaque patterns M along the normal to the first and second emissive surfaces 2, 2'. The light-emitting layer EL comprises non-emissive zones of the electromagnetic radiation that face the spacing zone ZE along the normal to the first and second emissive surfaces 2, 2'. The second structured electrode $E_2$ is advantageously made of a composite material comprising a metal matrix and a ceramic reinforcement (also called cermet). By way of a non-limiting example, the metal matrix can be made of Ag, and the ceramic reinforcement can be made of $WO_3$.

As illustrated in FIG. 8, the second structured electrode $E_2$ is advantageously coated with an encapsulation layer 4, arranged to protect the device from air and moisture.

Light-Emitting Layer

The light-emitting layer EL is advantageously made of a chiral organic material. By way of non-limiting examples, the chiral organic material can be:
  a helicene, such as a platinahelicene;
  chiral poly (fluorene-alt-benzothiadiazole) (c-PFBT), where "alt" denotes an alternating copolymer;
  a lanthanide complex;
  an iridium (III) complex.

Other examples of organic materials suitable for emitting circularly polarized electromagnetic radiation are provided in the document by J. Han et al., "*Recent Progress on Circularly Polarized Luminescent Materials for Organic Optoelectronic Devices*", Advanced Optical Materials, Vol. 6, 17, 2018.

The spectral range is advantageously selected from among:
  the visible range with wavelengths ranging between 400 nm and 780 nm;
  the UV-A range with wavelengths ranging between 315 nm and 400 nm;
  the near-infrared range with wavelengths ranging between 780 nm and 3 $\mu m$.

The light-emitting layer EL preferably is not in contact with the first and second electrodes $E_1$, $E_2$. The device can comprise, for example, transport layers (electrons and holes) and injection layers (electrons and holes) extending between an electrode $E_1$, $E_2$ and the light-emitting layer EL (called emissive layer).

Controlling the Polarization State

The device advantageously comprises a transmission diffraction grating 3, comprising transparent patterns 30 in the spectral range, dimensioned to modulate the phase of the electromagnetic radiation so as to control the circular polarization state of the electromagnetic radiation exiting the transmission diffraction grating 3.

The dimensioning and the interval of the transparent patterns 30 can be computed using simulation software notably using the formula of the transmission diffraction gratings, known to a person skilled in the art.

The transmission diffraction grating 3 can be arranged in a position selected from among:
  a first position, located between the first electrode $E_1$ and the light-emitting layer EL;
  a second position, located between the light-emitting layer EL and the second structured electrode $E_2$;
  a third position, located on the second structured electrode $E_2$.

By way of a non-limiting example, the transmission diffraction grating 3 is arranged in the second position in FIG. 8.

The transmission diffraction grating 3 can be made of a dielectric material (such as $SiO_2$), in which slits are periodically formed (for example, using photolithography and etching techniques). The slits define the transparent patterns 30 of the transmission diffraction grating 3.

Frequency Filtering

Figure 9:
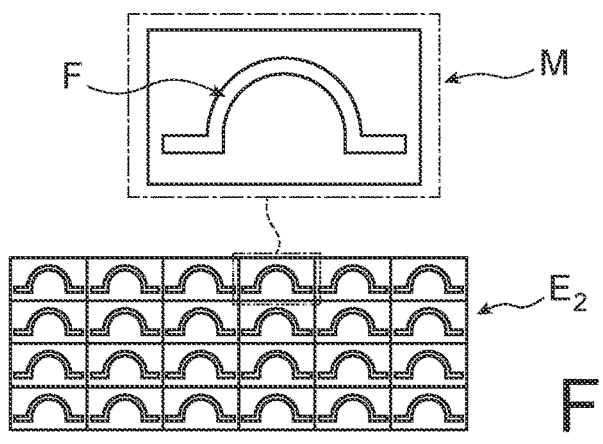
FIG. 9 is a schematic top view of a second structured electrode having a band-pass filter type frequency selective surface. The insert illustrates, on an exploded scale, a slit pattern in the form of an upper-case omega Ω.

The opaque patterns M are electrically conductive. As illustrated in FIG. 9, the spacing zone ZE advantageously forms slits F periodically arranged so that the second structured electrode $E_2$ has a band-pass filter type frequency selective surface (FSS). A frequency selective surface comprises flat periodic patterns formed by electrically conductive passive elements. When these patterns are subjected to a flat incident wave, said wave is partly transmitted and partly reflected. A frequency selective surface acts like a bandpass filter where it is possible to filter certain selected frequencies.

The slits F advantageously each have a cross-section in the form of an upper-case omega $\Omega$ so as to create chirality. Other forms can be contemplated, in this respect, the slits F can have a cross-section in the form of an arc of a circle, for example, in the form of the letter C. The electromagnetic behavior of the frequency selective surfaces is notably described in the book edited by A. Priou et al., "*Advances in Complex Electromagnetic Materials*", Springer, 1997.

By way of a non-limiting example, the frequency selective surface can comprise patterns made of copper, formed on a polytetrafluoroethylene (PTFE) substrate, and comprising slits F, the cross-section of which is preferably in the form of an upper-case omega $\Omega$. The PTFE substrate can be 2 $\mu m$ thick. Each pattern of the frequency selective surface can be square with 15 $\mu m$ long sides.

Top-Emitting Architecture

In a top-emitting architecture, as illustrated in FIGS. 2, 3, 7 and 8, the light-emitting device is formed on a first substrate $S_1$, which can be opaque in the spectral range. By way of a non-limiting example, the first substrate $S_1$ can be made of silicon. The electromagnetic radiation emitted by the light-emitting layer EL exits the second structured electrode $E_2$, opposite the first substrate $S_1$.

The light-emitting device is formed on the first substrate $S_1$ using deposition techniques that are known to a person skilled in the art. The first electrode $E_1$ can be formed on the first substrate $S_1$ using cathode sputtering physical vapor deposition. The light-emitting layer EL can be formed on the first electrode $E_1$ using:
  vacuum evaporation physical vapor deposition;
  chemical vapor deposition, for example, using Atomic Layer Deposition (ALD). The second electrode $E_2$ can be formed on the light-emitting layer EL through a stencil for the structuring thereof.

Bottom-Emitting Architecture

Figure 6:
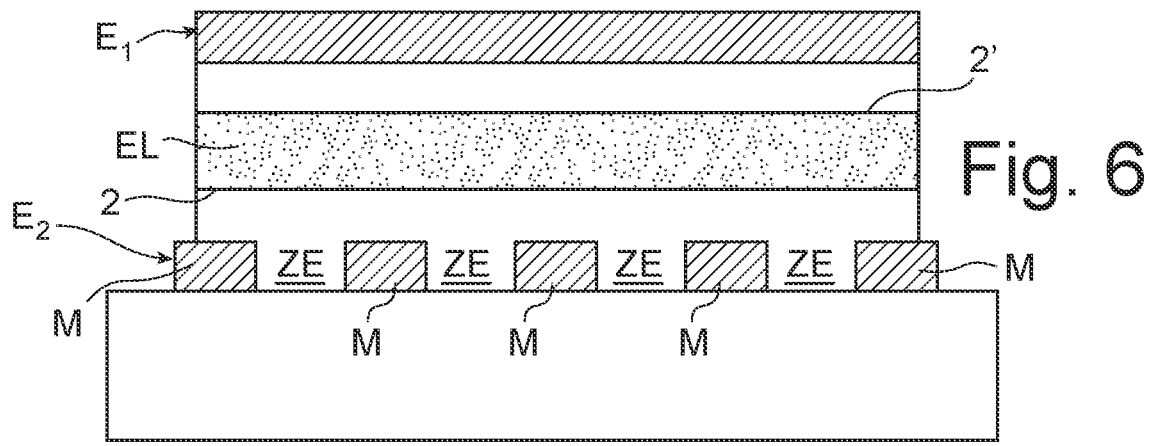
FIG. 6 is a schematic section view of a light-emitting device according to the invention, in a bottom-emitting architecture.

In a bottom-emitting architecture, as illustrated in FIG. 6, the light-emitting device is formed on a second substrate $S_2$, transparent in the spectral range. The electromagnetic radiation emitted by the light-emitting layer EL exits the second structured electrode $E_2$ and then propagates through the second substrate $S_2$. By way of a non-limiting example, the second substrate $S_2$ can be made of Indium Tin Oxide (ITO).

The light-emitting device is formed on the second substrate $S_2$ using deposition techniques that are known to a person skilled in the art. The first and second electrodes $E_1$, $E_2$ can be deposited using cathode sputtering physical vapor deposition. The second electrode $E_2$ can be formed using photolithography, etching techniques for the structuring thereof. The light-emitting layer EL can be formed on the second structured electrode $E_2$ using:

vacuum evaporation physical vapor deposition;

chemical vapor deposition, for example, using Atomic Layer Deposition (ALD).

The invention is not limited to the disclosed embodiments. A person skilled in the art is able to consider their technically effective combinations, and to replace them with equivalents.

The invention claimed is:

1. A light-emitting device, comprising:
   a first electrode, reflecting in a spectral range;
   a second electrode; and
   a light-emitting layer, extending between the first and second electrodes and configured to emit electromagnetic radiation in the spectral range, the electromagnetic radiation emitted by the light-emitting layer being circularly polarized in a first polarization direction, the electromagnetic radiation reflected by the first electrode being circularly polarized in a second polarization direction, opposite to the first polarization direction;
   wherein the second electrode is structured so as to define:
   opaque patterns in the spectral range arranged to block transmission of the circularly polarized electromagnetic radiation in the first polarization direction;
   a spacing zone spacing apart the opaque patterns from one another and transparent in the spectral range so as to allow transmission of the circularly polarized electromagnetic radiation in the second polarization direction.

2. The device as claimed in claim 1, wherein the electromagnetic radiation emitted by the light-emitting layer comprises rays, oriented toward the second structured electrode, and forming refraction cones each having a base; and the opaque patterns are arranged so as to cover part of the bases of the refraction cones.

3. The device as claimed in claim 1, wherein the light-emitting layer comprises a first emissive surface oriented toward the second structured electrode, and the opaque patterns occupy a total surface area having an area ranging between 30% and 70% of an area of the first emissive surface.

4. The device as claimed in claim 1, wherein the first electrode comprises reflective patterns in the spectral range arranged to form a reflection diffraction grating and dimensioned to modulate an amplitude of the electromagnetic radiation such that:
   the reflection diffraction grating reflects only a zero order of interference of the electromagnetic radiation; and
   the electromagnetic radiation exiting the reflection diffraction grating propagates at normal incidence.

5. The device as claimed in claim 1, comprising a transmission diffraction grating comprising transparent patterns in the spectral range, dimensioned to modulate a phase of the electromagnetic radiation so as to control a circular polarization state of the electromagnetic radiation exiting the transmission diffraction grating.

6. The device as claimed in claim 5, wherein the transmission diffraction grating is arranged in a position selected from among:
   a first position located between the first electrode and the light-emitting layer;
   a second position located between the light-emitting layer and the second structured electrode; and
   a third position located on the second structured electrode.

7. The device as claimed in claim 1, wherein the second structured electrode is made of a composite material comprising a metal matrix and a ceramic reinforcement.

8. The device as claimed in claim 1, wherein the opaque patterns are electrically conductive, and the spacing zone forms slits periodically arranged so that the second structured electrode has a band-pass filter type frequency selective surface.

9. The device as claimed in claim 8, wherein the slits each have a cross-section in a form of an upper-case omega.

10. The device as claimed in claim 1, wherein the first electrode is made of a metal material.

11. The device as claimed in claim 1, wherein the light-emitting layer is made of a chiral organic material.

12. The device as claimed in claim 1, wherein the spectral range is selected from among:
   the visible range with wavelengths ranging between 400 nm and 780 nm;
   the UV-A range with wavelengths ranging between 315 nm and 400 nm; and
   the near-infrared range with wavelengths ranging between 780 nm and 3 µm.

13. The device as claimed in claim 2, wherein the opaque patterns are arranged so as to cover all of the bases of the refraction cones.

* * * * *